(12) United States Patent
Sohda et al.

(10) Patent No.: US 10,825,649 B2
(45) Date of Patent: Nov. 3, 2020

(54) ELECTRON BEAM DEVICE (71) Applicant: HITACHI, LTD., Tokyo (JP)

(72) Inventors: Yasunari Sohda, Tokyo (JP); Daisuke Bizen, Tokyo (JP); Makoto Sakakibara, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/269,345

(22) Filed: Feb. 6, 2019

(65) Prior Publication Data

US 2019/0295805 A1 Sep. 26, 2019

(30) Foreign Application Priority Data

Mar. 23, 2018 (JP) ................. 2018-056586

(51) Int. Cl.
*H01J 37/28* (2006.01)
*H01J 37/141* (2006.01)
*H01J 37/12* (2006.01)

(52) U.S. Cl.
CPC ............ *H01J 37/28* (2013.01); *H01J 37/141* (2013.01); *H01J 37/12* (2013.01); *H01J 2237/1202* (2013.01)

(58) Field of Classification Search
CPC .. H01J 2237/1202; H01J 37/10; H01J 37/141; H01J 37/04; H01J 37/09; H01J 37/28
See application file for complete search history.

(56) References Cited

U.S. PATENT DOCUMENTS

| 4,963,737 A | 10/1990 | Suzuki |
| 5,442,182 A * | 8/1995 | Kubo ............... H01J 37/141 |
| | | 250/396 ML |
| 5,949,078 A | 9/1999 | Ooaeh et al. |
| 6,680,481 B2 | 1/2004 | Okino |
| 6,835,511 B2 | 12/2004 | Hirayanagi |
| 6,894,291 B2 | 5/2005 | Okino et al. |
| 6,917,048 B2 | 7/2005 | Fujiwara et al. |
| 9,799,483 B2 | 10/2017 | Shojo et al. |

(Continued)

FOREIGN PATENT DOCUMENTS

| JP | H01319237 A | 12/1989 |
| JP | 2001074437 A | 3/2001 |

(Continued)

OTHER PUBLICATIONS

Office Action dated Dec. 5, 2019 in Korean Application No. 10-2018-0164693.

*Primary Examiner* — Wyatt A Stoffa (74) *Attorney, Agent, or Firm* — Miles & Stockbridge, P.C.

(57) ABSTRACT

The present invention provides an electron beam device suitable for observing the bottom of a deep groove or a deep hole with a high degree of accuracy under a large current condition. The electron beam device has: an electron optical system having an irradiation optical system to irradiate an aperture 153 with an electron beam 116 emitted from an electron source 100 and a reduction projection optical system to project and form an aperture image of the aperture on a sample 114; and a control unit 146 to control a projection magnification of the aperture image of the aperture projected and formed on the sample and an aperture angle 402 of the electron beam emitted to the sample by the electron optical system.

9 Claims, 12 Drawing Sheets

(56) References Cited

U.S. PATENT DOCUMENTS

| | | | |
|---|---|---|---|
| 2003/0077530 A1 | 4/2003 | Fujiwara et al. | |
| 2003/0089863 A1 | 5/2003 | Hirayanagi | |
| 2003/0111618 A1 | 6/2003 | Udagawa et al. | |
| 2004/0011959 A1* | 1/2004 | Koike | H01J 37/28 250/310 |
| 2006/0226362 A1* | 10/2006 | Kitsuki | H01J 37/263 250/310 |
| 2009/0184256 A1* | 7/2009 | Shigeto | H01J 37/28 250/396 R |
| 2010/0320385 A1* | 12/2010 | Kitsuki | H01J 37/04 250/310 |
| 2011/0095184 A1* | 4/2011 | Tachibana | G01N 23/225 250/311 |
| 2011/0215243 A1* | 9/2011 | Ezumi | H01J 37/28 250/307 |
| 2013/0277554 A1* | 10/2013 | Ren | H01J 37/261 250/310 |
| 2014/0001359 A1* | 1/2014 | Ezumi | H01J 37/28 250/307 |
| 2015/0034836 A1* | 2/2015 | Sohda | G21K 1/093 250/398 |
| 2015/0076349 A1 | 3/2015 | Sasajima et al. | |
| 2015/0179394 A1 | 6/2015 | Saito et al. | |
| 2017/0025251 A1* | 1/2017 | Enyama | H01J 37/153 |
| 2017/0053777 A1* | 2/2017 | Shojo | H01J 37/09 |
| 2019/0066972 A1* | 2/2019 | Frosien | H01J 37/3177 |

FOREIGN PATENT DOCUMENTS

| | | |
|---|---|---|
| JP | 2004342628 A | 12/2004 |
| JP | 2006078591 A | 3/2006 |
| JP | 2007067192 A | 3/2007 |
| JP | 2013251088 A | 12/2013 |
| JP | 2015216086 A | 12/2015 |
| KR | 100241995 B1 | 2/2000 |
| WO | 2013179808 A1 | 12/2013 |

* cited by examiner

ELECTRON BEAM DEVICE

CROSS-REFERENCE TO RELATED APPLICATION

This application claims priority to Japanese Patent Application No. 2018-056586 filed on Mar. 23, 2018, the entire contents of which are incorporated by reference herein.

TECHNICAL FIELD

The present invention relates to an electron beam device to carry out observation, inspection, and measurement by using an electron beam.

BACKGROUND ART

An electron beam device such as a scanning electron microscope (SEM) used for observing, inspecting, and measuring a sample with an electron beam irradiates the sample by accelerating electrons emitted from an electron source and converging the electrons on the sample surface by an electrostatic lens or an electromagnetic lens. Such electrons are referred to as primary electrons. Secondary electrons (electrons of low energies are referred to as secondary electrons and electrons of high energies are referred to as backscattered electrons dividedly in some cases) are emitted from the sample by the incidence of the primary electrons. A scanning image of a fine pattern and a composition distribution of the surface of a sample can be obtained by detecting such secondary electrons while an electron beam is deflected and scans the surface of the sample. Further, an absorbed current image can also be formed by detecting electrons absorbed in a sample.

In scanning electron microscopy, it is necessary to increase the amperage of an electron beam and thus increase a signal amount for observing the bottom of a deep groove or a deep hole or measuring high-precision pattern dimensions. Moreover, unless an aperture angle of an electron beam is reduced, a beam blur caused by a defocus increases and it comes to be difficult to observe the bottom of a deep groove or a deep hole separately from the upper part. In Patent Literature 1, a means of reducing an aperture angle under large current conditions in a charged particle beam apparatus used for the applications of a semiconductor inspection device and the like is disclosed. In Patent Literature 2 in contrast, an electron optical system using a multistage lens applied to an electron beam exposure apparatus is disclosed. The electron optical system of an electron beam exposure apparatus has a high beam current density with the aim of increasing an imaging speed.

CITATION LIST

Patent Literature

Patent Literature 1: Japanese Unexamined Patent Application Publication No. 2015-216086
Patent Literature 2: Japanese Unexamined Patent Application Publication No. 2007-67192

SUMMARY OF INVENTION

Technical Problem

In a general scanning electron microscope disclosed in Patent Literature 1, an electron source image is formed on a sample surface as it will be described later. The projection magnification of an electron source image has to be increased in order to obtain a large current after an aperture angle is reduced. If a projection magnification is increased, noises such as the uneven brightness of an electron source, the vibrations of a device, and the like are likely to be reflected on an electron source image and resultantly various problems such as the deterioration of an acquired image caused by lowering the noise immunity of the device, the characteristic difference (machine difference) between devices caused by the individual difference between electron sources, and the like are created.

Further, in such an electron beam exposure apparatus as disclosed in Patent Literature 2, an electron beam for irradiation is fixed under predetermined optical conditions suitable for imaging and is not used under the conditions of varying a beam current density emitted to an observed sample in conformity with the sample like a scanning electron microscope. In an electron optical system of Patent Literature 2 therefore, control of optical conditions of an electron beam is not disclosed.

The present invention provides an electron beam device suitable for observing the bottom of a deep groove or a deep hole with a high degree of accuracy under large current conditions.

Solution to Problem

An electron beam device according to an embodiment of the present invention has: an electron optical system having an irradiation optical system to irradiate an aperture with an electron beam emitted from an electron source and a reduction projection optical system to project and form an aperture image of the aperture on a sample; and a control unit to control a projection magnification of the aperture image of the aperture projected and formed on the sample and an aperture angle of the electron beam emitted to the sample by the electron optical system.

Other problems and novel features will be obvious from the descriptions and attached drawings of the present description.

Advantageous Effects of Invention

Even under large current conditions, an appropriate SEM image can be obtained by controlling a projection magnification and an aperture angle of an electron beam and particularly a deep groove or a deep hole is observed effectively.

DESCRIPTION OF EMBODIMENTS

Embodiments according to the present invention are explained in reference to the drawings. Although the present invention is explained on the basis of a scanning electron microscope here, the present invention can be applied also to an electron beam device other than a scanning electron microscope.

Figure 1:
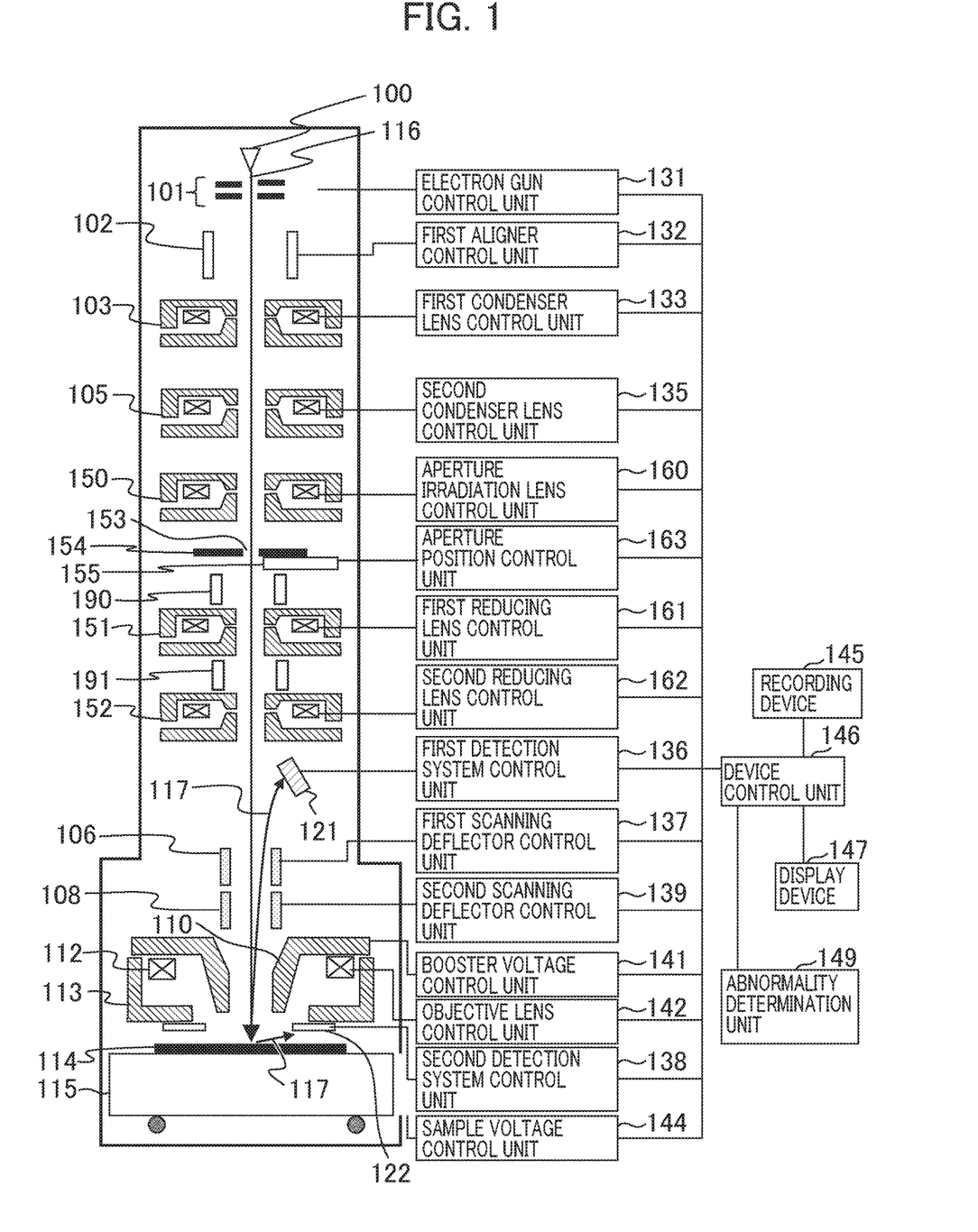
FIG. 1 is an overall schematic diagram of a scanning electron microscope.

FIG. 1 is an overall schematic diagram showing a scanning electron microscope according to an embodiment of the present invention. An electron beam (primary electrons 116) emitted from an electron source 100 with an electron gun 101: passes through three-stage lenses of a first condenser lens 103, a second condenser lens 105, and an aperture irradiation lens 150; and is emitted to an aperture plate 154. An aperture 153 is formed in the aperture plate 154. Further, the aperture 153 is arranged so that the position of the aperture relative to an electron beam may be adjusted by an aperture position control unit 163 to control an aperture plate stage 155. An electron beam having passed through the aperture 153: passes through three-stage lenses of a first reducing lens 151, a second reducing lens 152, and an objective lens 113; and is emitted to a sample 114 retained by a stage 115. An image (aperture image) of the aperture 153 is projected and formed on the sample 114 by the electron optical system, the details being described later. The aperture 153 is desirably a round aperture. The reason is that a round aperture is isotropic and hence image processing is easily performed.

Meanwhile, in this configuration example, since an electrostatic lens is formed by applying a positive voltage to a magnetic path 110 over the objective lens from a booster voltage control unit 141 and a negative voltage to the sample 114 from a sample voltage control unit 144, the objective lens 113 is a magnetic-electric field superimposing lens. Further, a magnetic path aperture of the objective lens 113 is directed to the side of the sample 114 and has a lens structure called a semi-in-lens type. An objective lens control unit 142 controls an excitation current flowing in an objective lens col 112.

Secondary electrons 117 (low-speed electrons are classified as secondary electrons and high-speed electrons are classified as backscattered electrons in some cases) emitted by irradiating the sample 114 with an electron beam are detected by a first detector 121 located in the middle of a reduction projection optical system (an electron optical system of a scanning electron microscope is classified between above and below an aperture plate 154 and an electron optical system from the aperture plate 154 to the side of the sample 114 is referred to as a reduction projection optical system and an electron optical system from the electron source 100 to the aperture plate 154 is referred to as an irradiation optical system) or a second detector 122 located at the bottom of the objective lens 113. The first detector 121 is controlled by a first detection system control unit 136 and the second detector 122 is controlled by a second detection system control unit 138. Primary electrons 116 scan the sample 114 two-dimensionally by a first scanning deflector 106 and a second scanning deflector 108 and resultantly two-dimensional image information of the sample 114 can be obtained. Two-dimensional scanning is generally carried out while the start point of line scanning in a lateral direction is shifted in a longitudinal direction. The center position of the two-dimensional image information is decided by the first scanning deflector 106 controlled by a first scanning deflector control unit 137 and the second scanning deflector 108 controlled by a second scanning deflector control unit 139. In this example, the first scanning deflector 106 and the second scanning deflector 108 comprise electrostatic deflectors respectively.

Meanwhile, the electron gun 101 is controlled by an electron gun control unit 131, the first condenser lens 103 is controlled by a first condenser lens control unit 133, the second condenser lens 105 is controlled by a second condenser lens control unit 135, the aperture irradiation lens 150 is controlled by an aperture irradiation lens control unit 160, the first reducing lens 151 is controlled by a first reducing lens control unit 161, and the second reducing lens 152 is controlled by a second reducing lens control unit 162. Further, a first aligner 102 to control the beam axis of the primary electrons 116: is arranged at the latter stage of the electron gun 101; and is controlled by a first aligner control unit 132. The control units for the components and detectors in the electron optical system are controlled integrally by a device control unit 146 to control the whole devices on the basis of control data and the like stored in a recording device 145. A detection signal detected by the first detector 121 or the second detector 122 is used by being stored in the recording device 145 or displayed in a display device 147. Further, an abnormality determination unit 149 extracts a defect candidate of the sample 114 from two-dimensional image information obtained from a detection signal.

Figure 2:
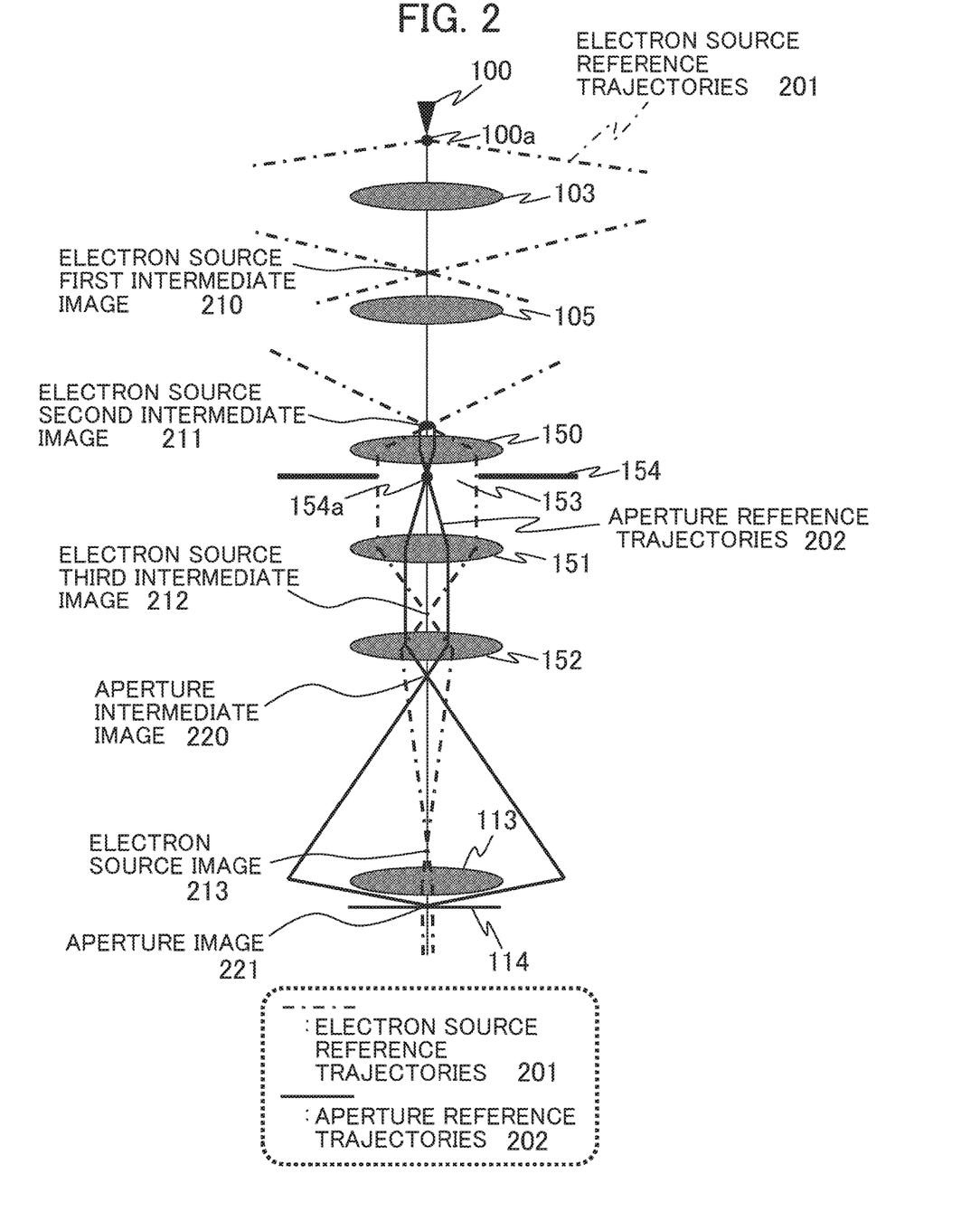
FIG. 2 is a view explaining the electron trajectories of a scanning electron microscope.

Reference trajectories of electrons in the electron optical system of the scanning electron microscope in FIG. 1 are shown in FIG. 2. As the reference trajectories, electron source reference trajectories 201 (dot-dash lines) having an electron source center 100a as an object point and aperture reference trajectories 202 (solid lines) having an aperture center 154a as an object point are shown. In the electron source reference trajectories 201, electron beams having the electron source center 100a as the object point: form an electron source second intermediate image 211 by the two condenser lenses 103 and 105; and are emitted to the aperture plate 154 as parallel beams by the aperture irradiation lens 150. The parallel beams having passed through the aperture 153 form an electron source image 213 by the two reducing lenses 151 and 152. On this occasion, the electron source image 213 is controlled so as to be formed on a back focal plane of the objective lens 113.

Figure 3:
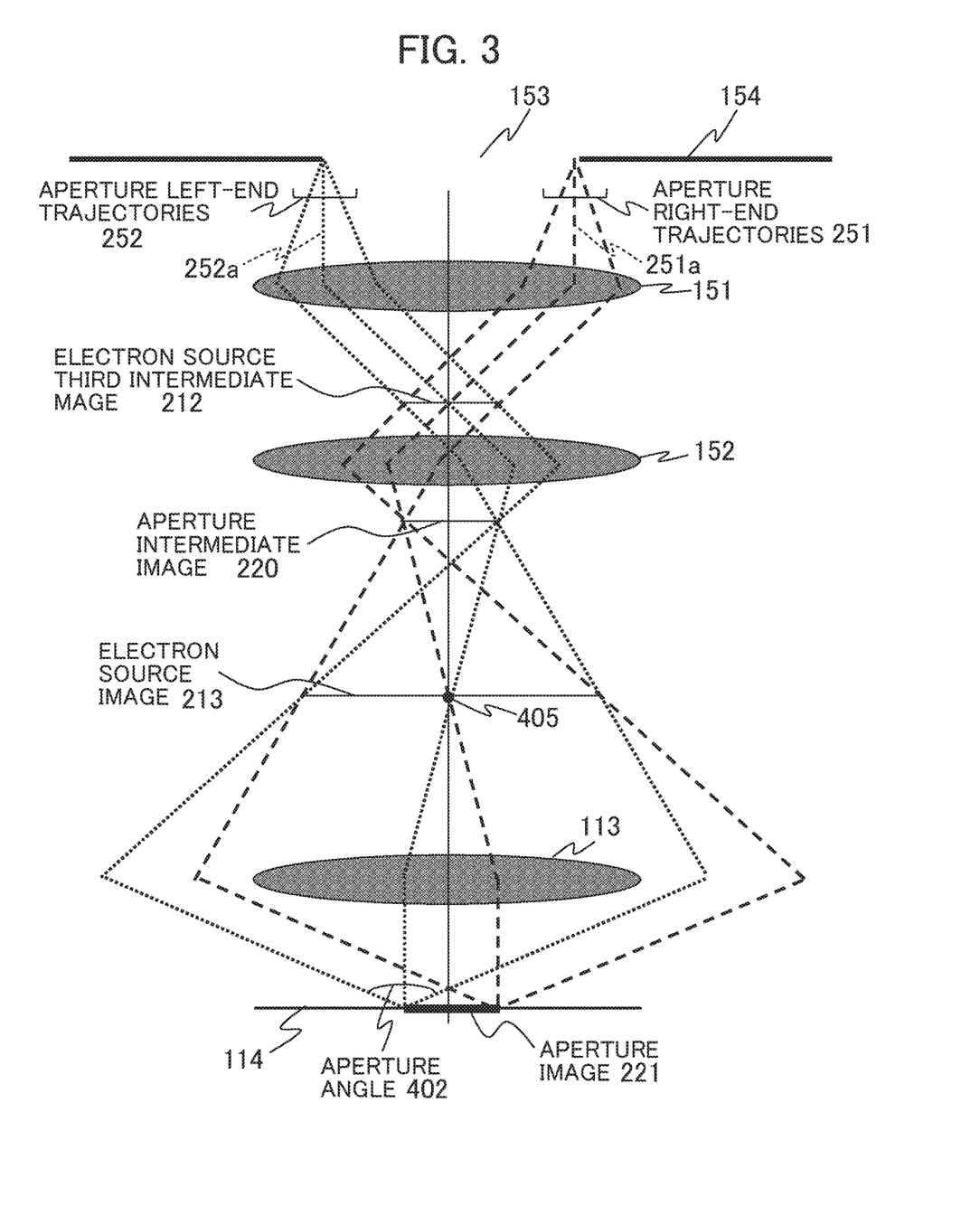
FIG. 3 is a view showing the details of aperture reference trajectories in FIG. 2.

Meanwhile, in the aperture reference trajectories 202, electron beams having the aperture center 154a as the object point form a reduced aperture image 221 of the aperture 153 on the sample 114 by the two reducing lenses 151 and 152 and the objective lens 113. Details of the aperture reference trajectories 202 are shown in FIG. 3. FIG. 3 shows electron trajectories in three directions originated from each of the right end and the left end of the aperture 153 (referred to as aperture right-end trajectories 251 (broken lines) and aperture left-end trajectories 252 (dotted lines), respectively) in the electron trajectories of projecting and imaging the aperture 153 of the aperture plate 154 as the aperture image 221 on the sample 114. The situation that the electron trajectories form an aperture intermediate image 220 by the first reducing lens 151 and the second reducing lens 152 and then project and form the aperture 153 as the aperture image 221 on the sample 114 at a magnification conforming to lens conditions is shown. Here, the respective parallel trajectory parts of the electron source reference trajectories 201 and the aperture reference trajectories 202 are vulnerable to disturbance. Magnetic shields 190 and 191 are therefore arranged at the parallel trajectory parts, in other words between the aperture plate 154 and the first reducing lens 151 and between the first reducing lens 151 and the second reducing lens 152, respectively (refer to FIG. 1).

Figure 4:
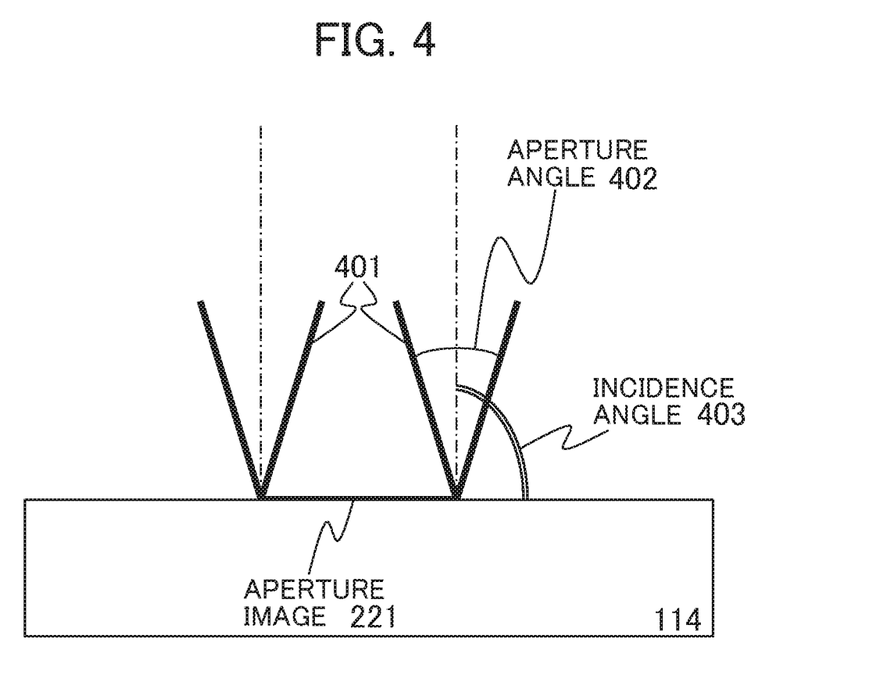
FIG. 4 is a view showing electron trajectories in the vicinity of a sample.

Electron trajectories in the vicinity of the sample 114 are shown in FIG. 4. Primary electrons 401 having electron trajectories having both the ends of the aperture 153 of the aperture plate 154 as object points: are shown in the figure; and focus on the sample 114 at the angle of an aperture angle 402 by the electron trajectories shown in FIG. 3. The aperture image 221 is formed between the left and right focus positions. Further, an angle between a trajectory passing through the center of each of aperture angles 402 and the sample surface is an incidence angle 403 and both the left and right incidence angles 403 are about 90 degrees in the present embodiment. The state is called telecentric and is an important electron beam characteristic in the observation of a deep groove and a deep hole. The purpose of forming an electron source image 213 on the back focal plane of the objective lens 113 as explained in FIG. 2 is to materialize this state. In other words, the back focal plane of the objective lens 113 is a position where parallel beams focus when the parallel beams enter in the optical axis direction from the side of the sample 114 toward the objective lens 113. As shown in FIG. 3, a trajectory 251a going straight in the optical axis direction in the aperture right-end trajectories 251 and a trajectory 252a going straight in the optical axis direction in the aperture left-end trajectories 252 enter a point 405 at the position of the electron source image 213 by the two reducing lenses 151 and 152. Since the point 405 is a point on the back focal plane of the objective lens 113, an electron beam entering the objective lens 113 from the point 405 has an electron trajectory vertically entering the sample surface.

In the observation of a three-dimensional structure like a deep groove or a deep hole, the aperture angle 402 has to be small in order to reduce a beam blur at an upper surface part even when a focus is formed at a bottom surface part. Meanwhile, since the escape probability of signal electrons (secondary electrons 117) coming from the bottom of a three-dimensional structure is low, a large current is required in order to obtain an image of a high SN. Since the brightness of an electron source is limited, resultantly an aperture image comes to be large under the optical conditions of obtaining a large current while an aperture angle is reduced. In contrast, in an ordinary electron beam device of an electron source imaging type, an electron source image is formed on the surface of a sample 114. Under the optical conditions of obtaining a large current while an aperture angle is reduced, the electron source image comes to be large similarly to the aperture image. In the case of using a Zr/O Schottky electron source as the electron source 100, if an electron source image diameter is set at 10 nm for a large current, the virtual light source diameter of the Zr/O Schottky electron source is 20 to 30 nm and hence the magnification of the electron optical system is 0.33 to 0.5. If the magnification is such large, mechanical vibrations generated at the upper part of an electron optical system and beam vibrations caused by electron noises can scarcely be reduced and the performance as an electron beam device is impaired largely.

Figure 5:
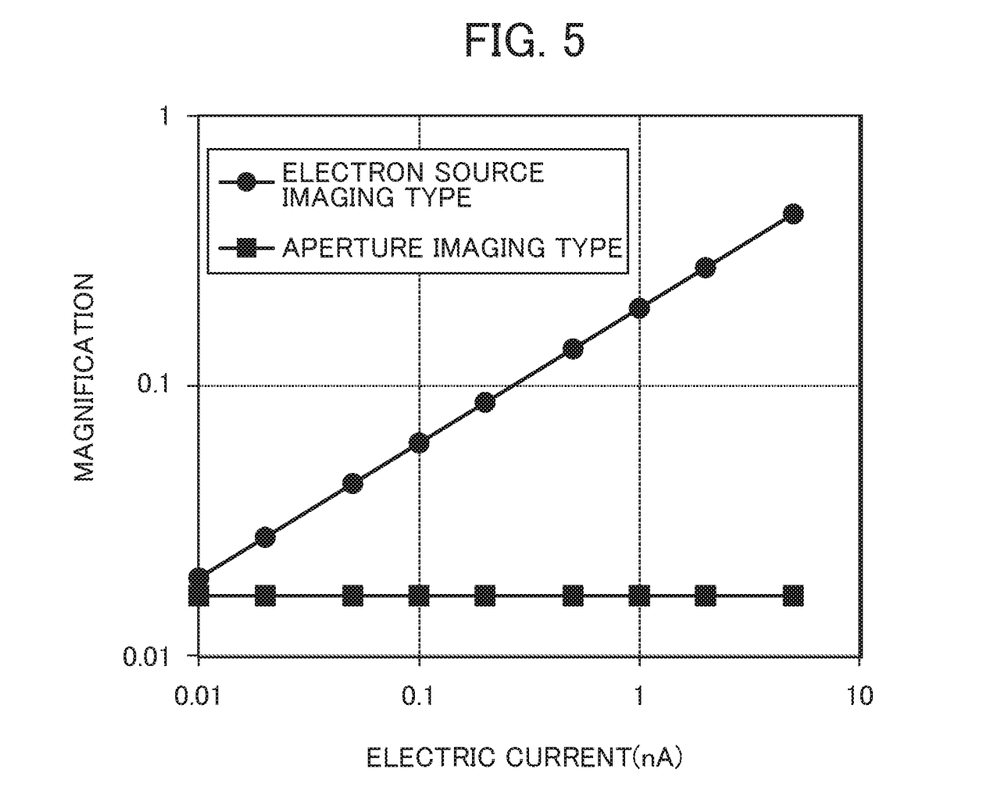
FIG. 5 is a graph showing a relationship between an amperage and a magnification in an electron optical system.

In an electron beam device of an aperture imaging type according to the present embodiment, if an aperture image diameter is set equally at 10 nm and an aperture having a diameter of 0.4 μm for example is used as an aperture 153, the magnification of a reduction projection optical system can be 0.025. Mechanical vibrations generated at the upper part of an electron optical system and beam vibrations caused by electron noises therefore can be reduced largely. There are various ideas about the shape of an aperture but a round shape and a diameter of 1 μm or smaller are effective. Further, by switching the aperture size of the aperture plate 154, the magnification for obtaining an aperture image of the same size can be changed and hence the degree of freedom can be given to the selection of the projection magnification in the reduction projection optical system. It is also possible to: form a plurality of apertures having different sizes in the aperture plate 154 and switch the apertures; or form an aperture the size of which is variable. An example of a relationship between an amperage and a magnification in an electron optical system (reduction projection optical system) in the case of keeping an aperture angle constant is shown in FIG. 5. In the electron source imaging type, an electron source image diameter increases as electric current increases and a magnification also increases accordingly. In contrast, in an aperture imaging type, an example of increasing an aperture size in response to the increase of electric current is shown. In this way, by increasing an aperture size in response to the increase of electric current, a magnification can be kept small.

Here, the reason why a round aperture is desirably used for the aperture 153 in the aperture plate 154 is that, if an electron beam of a shape having anisotropy is used for scanning in the electron microscopic image observation of a sample 114, an acquired image cannot accurately reflect a sample structure. By using a round aperture, an unintended anisotropy is never added to an image.

Figure 6:
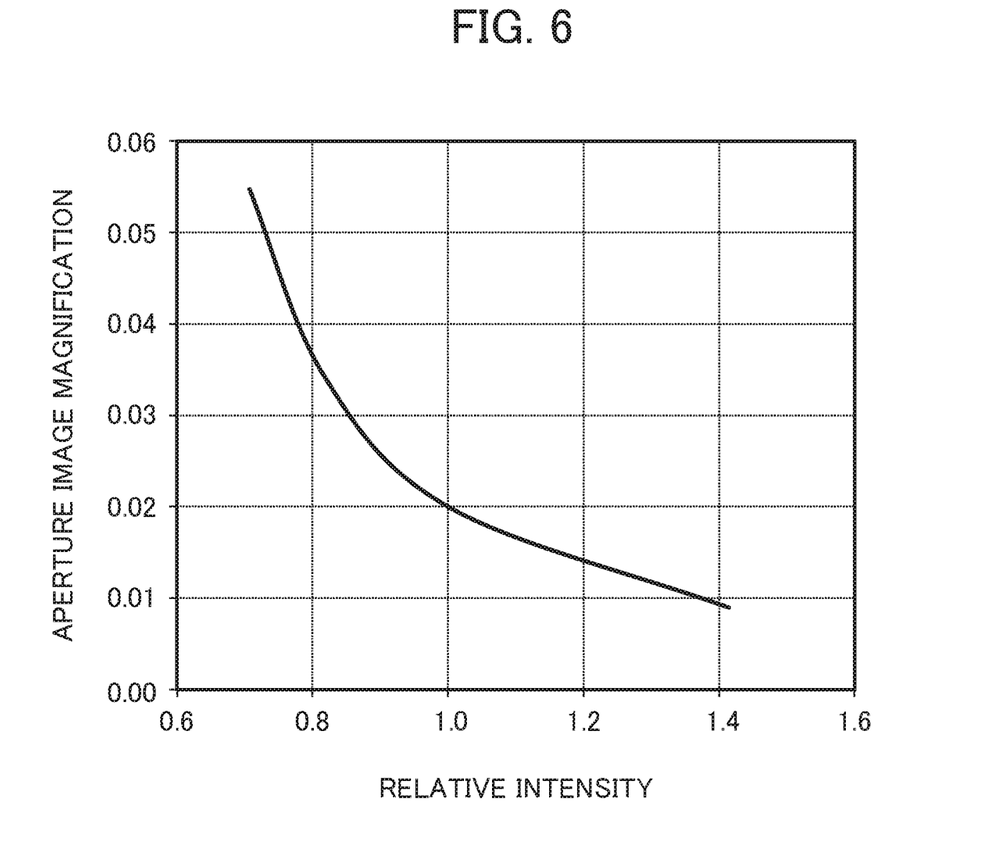
FIG. 6 is a graph explaining aperture image magnification control.

Control of an electron optical system is explained hereunder. In electron microscopy, an amperage and an aperture angle have to be optimized in accordance with the structure and material of an imaging object. When the brightness of an electron gun is assumed to be constant, an amperage is proportional to the product of the square of an aperture angle and the square of an aperture image size (aperture image area). In order to control an amperage at an identical aperture angle by using an identical aperture therefore, a projection magnification of an aperture 153 has to be controlled. The results of controlling a magnification of projecting an aperture 153 on a sample are shown in FIG. 6. In the reduction projection optical system, the device control unit 146 controls the first reducing lens 151 and the second reducing lens 152 by interlocking each other. The horizontal axis of FIG. 6 represents a relative intensity of the second reducing lens 152 to the first reducing lens 151. When a magnification is reduced, a predetermined magnification is given by a relative intensity of strongly exciting the second reducing lens 152 and weakly exciting the first reducing lens 151. By connectively controlling the excitation directions of the first reducing lens 151 and the second reducing lens 152 to opposite directions in this way, it is possible to: keep the position of an electron source image 213 on the back focal plane of an objective lens; and create a telecentric state (refer to FIG. 4). Finally, a focus is adjusted on a sample by slightly weakly exciting the objective lens. In this way, at least three lenses are required to be controlled in order to adjust a plurality of optical characteristics and the intensities of the second reducing lens and the other two lenses are controlled inversely. When a magnification is increased, the excitation directions of the three lenses are controlled connectively in the directions opposite to the directions of reducing a magnification that has been explained earlier.

Further, because an aperture angle also changes by this operation, aperture angle control that will be described below is also required.

Figure 7A:
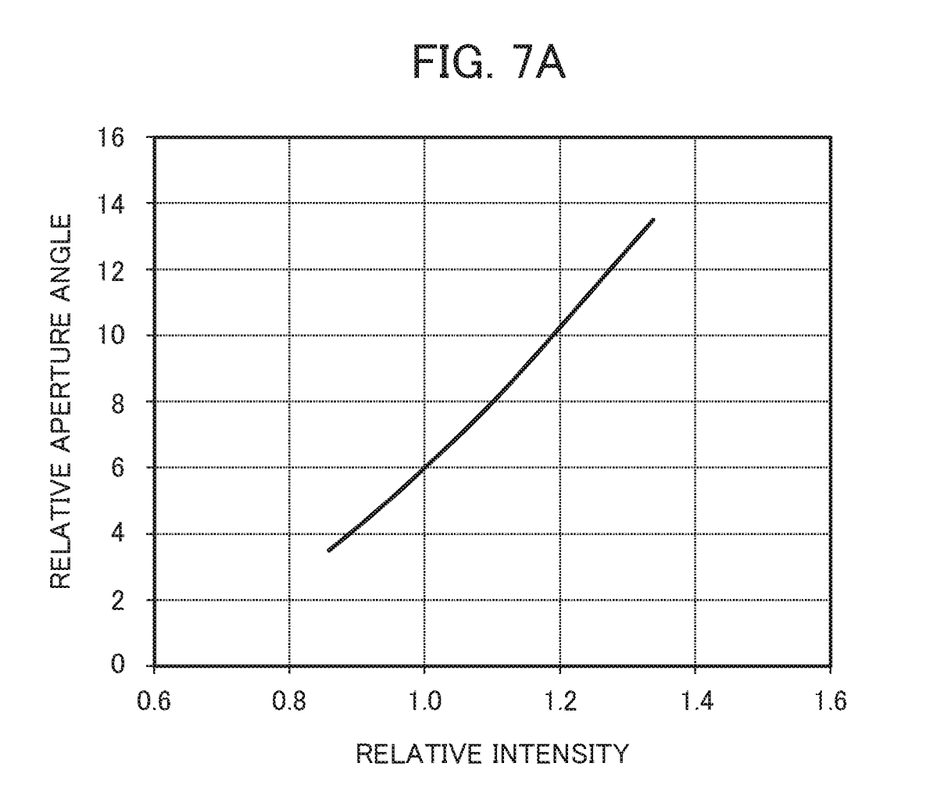
FIG. 7A is a graph showing aperture angle control results.

The results of controlling an aperture angle, which is another control parameter, on a sample surface are shown in FIG. 7A. In an irradiation optical system, the device control unit 146 controls the first condenser lens 103 and the second condenser lens 105 by interlinking each other. The horizontal axis represents a relative intensity of the second condenser lens to the first condenser lens. The aperture irradiation lens 150 is a single-focus lens and hence is desirably used by fixing the intensity in order to avoid the influence of magnetic response and hysteresis. In order to use the lenses by fixing the position of an electron source second intermediate image 211 therefore, the first condenser lens 103 and the second condenser lens 105 are controlled connectively in opposite excitation directions.

Figure 7B:
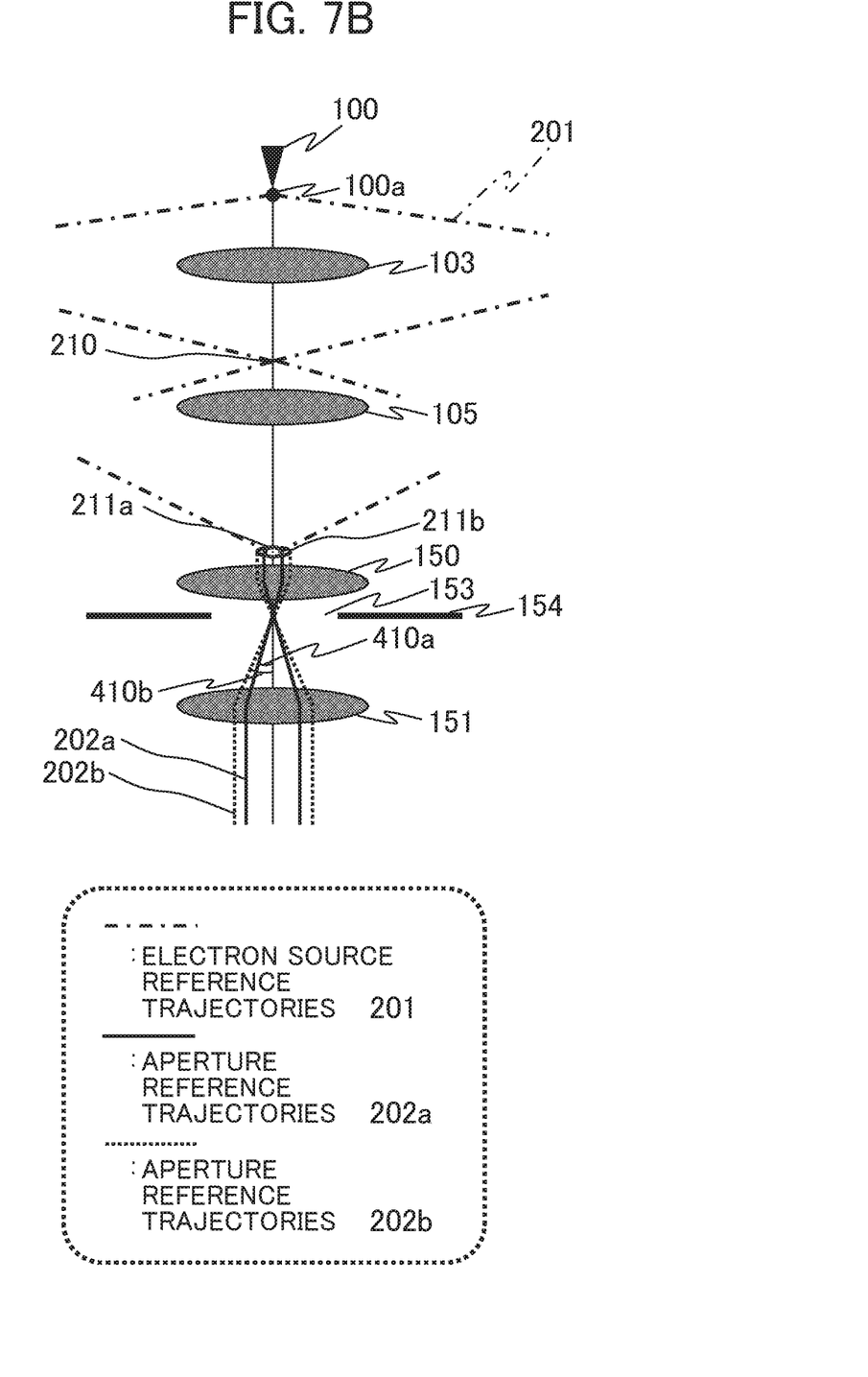
FIG. 7B is a view explaining the principle of aperture angle control.

The principle of aperture angle control is explained in reference to FIG. 7B. In order to increase an aperture angle, the second condenser lens 105 is strongly excited and the first condenser lens 103 is weakly excited. As a result, the position of an electron source first intermediate image 210 can be shifted upward while the position of the electron source second intermediate image 211 is fixed. FIG. 7B shows an electron source second intermediate image 211a in the state of a relatively small aperture angle and an electron source second intermediate image 211b in the state of a relatively large aperture angle. As a result of shifting the position of the electron source first intermediate image 210 upward, the electron source second intermediate image 211b comes to be larger than the electron source second intermediate image 211a. As a result, with regard to an angle between an aperture reference trajectory 202a of an aperture irradiated by the electron source second intermediate image 211a and an optical axis (half aperture angle of the aperture reference trajectory 202a on an aperture plane) 410a and an angle between an aperture reference trajectory 202b of an aperture irradiated by the electron source second intermediate image 211b and an optical axis (half aperture angle of the aperture reference trajectory 202b on an aperture plane) 410b, the angle 410b is larger than the angle 410a. With regard to an aperture reference trajectory 202, an aperture angle and the vertical irradiation to the first reducing lens 151 should be taken into account and, by controlling the two lenses (the first condenser lens 103 and the second condenser lens 105), the size can be controlled while the position of an electron source second intermediate image 211 is maintained. Further, in order to reduce an aperture angle, control in the inverse direction should be adopted.

As explained above, in an electron optical system according to the present embodiment, as long as an irradiation optical system and a reduction projection optical system have at least three lenses respectively, two optical parameters of a projection magnification and an aperture angle can be controlled. Two lenses connectively controlling excitation and a lens used by fixing excitation are required in the irradiation optical system and two lenses connectively controlling excitation and a lens used by mostly fixing excitation are required in the reduction projection optical system.

Figure 8:
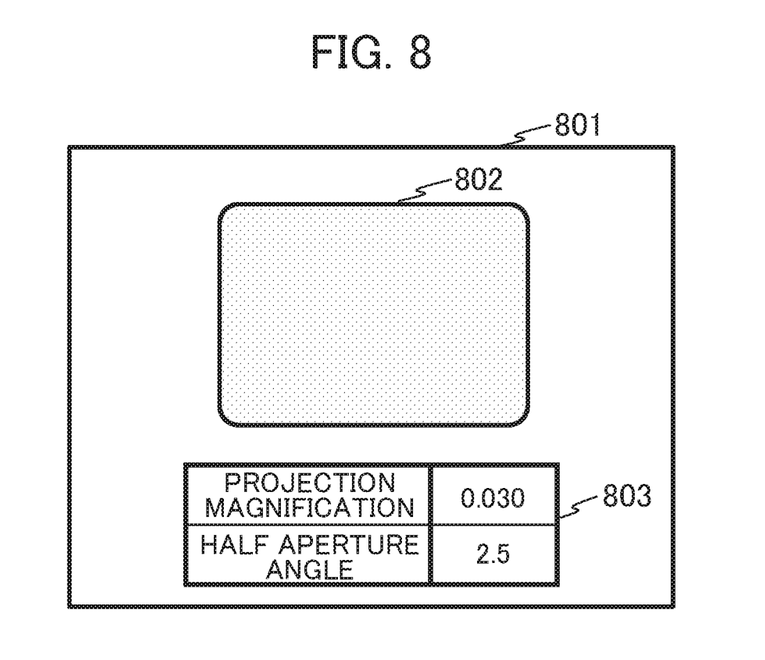
FIG. 8 shows an example of a GUI displayed in a display device.

An example of a GUI (Graphical User Interface) displayed on a display device 147 is shown in FIG. 8. In a screen 801, an SEM image display section 802 to display an SEM image (two-dimensional image information from detection signals) acquired by a scanning electron microscope and an optical parameter display section 803 to display optical parameters including a projection magnification and a half aperture angle (½ of an aperture angle (refer to FIG. 4), the unit of a half aperture angle is "mrad") so as to be able to easily adjust and decide optical parameters in an electron optical system are arranged.

Figure 9:
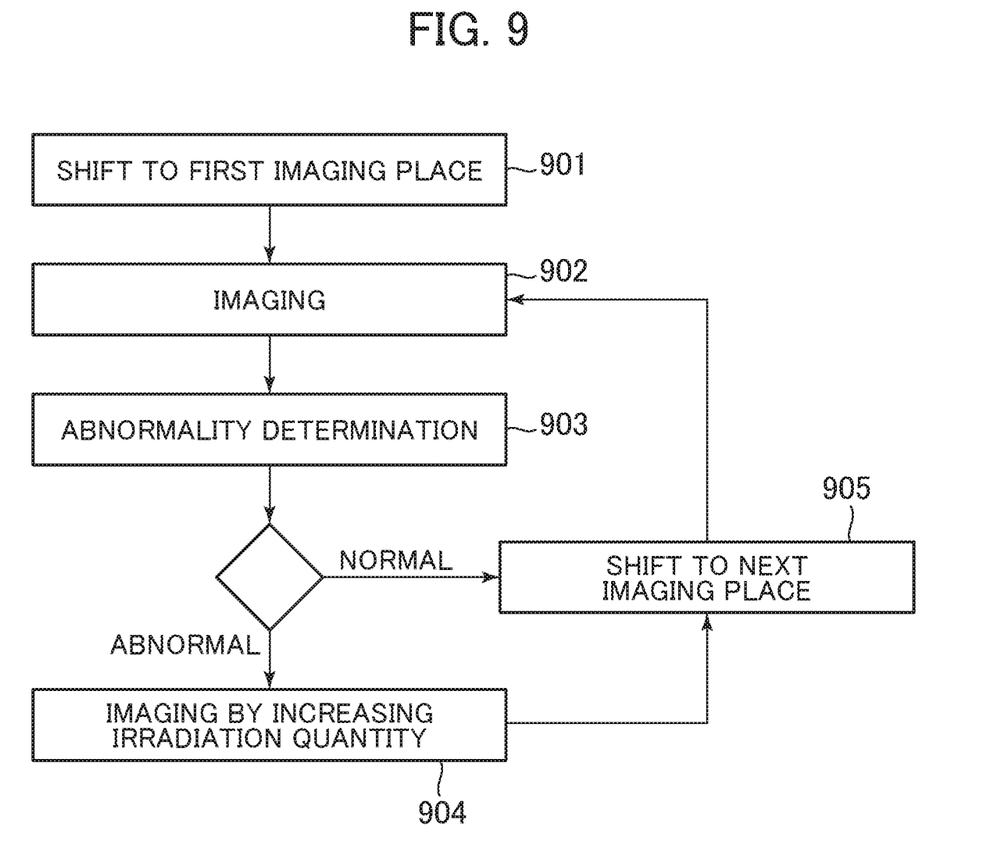
FIG. 9 is a flowchart for high-speed inspection.

An inspection method of a sample using an electron beam device according to the present embodiment is explained hereunder. A flowchart for high-speed inspection is shown in FIG. 9. An optical condition of a large current is required for high-speed inspection, on this occasion the size of an aperture image increases in order to ensure such optical conditions as to obtain a small aperture angle and a large current suitable for the observation of a microstructure of a sample, and the resolution and the SN of a resultantly obtained SEM image (two-dimensional image information from detection signals) tend to deteriorate. As a result, a relationship of a trade-off is caused between high-speed inspection and the clearness of an acquired SEM image. Such two-stage imaging as shown in FIG. 9 is carried out accordingly. An electron beam shifts to a first imaging place (Step 901), an image is photographed (Step 902), and the photographed SEM image (two-dimensional image information from detection signals) is subjected to abnormality determination by an abnormality determination unit 149 (Step 903). When the photographed SEM image is judged to have a defect candidate, an image is photographed by increasing the total irradiation quantity of the electron beam and an SEM image of an improved SN is obtained (Step 904). When the photographed SEM image is judged not to have a defect candidate, the electron beam shifts to a next imaging place (Step 905).

Figure 10:
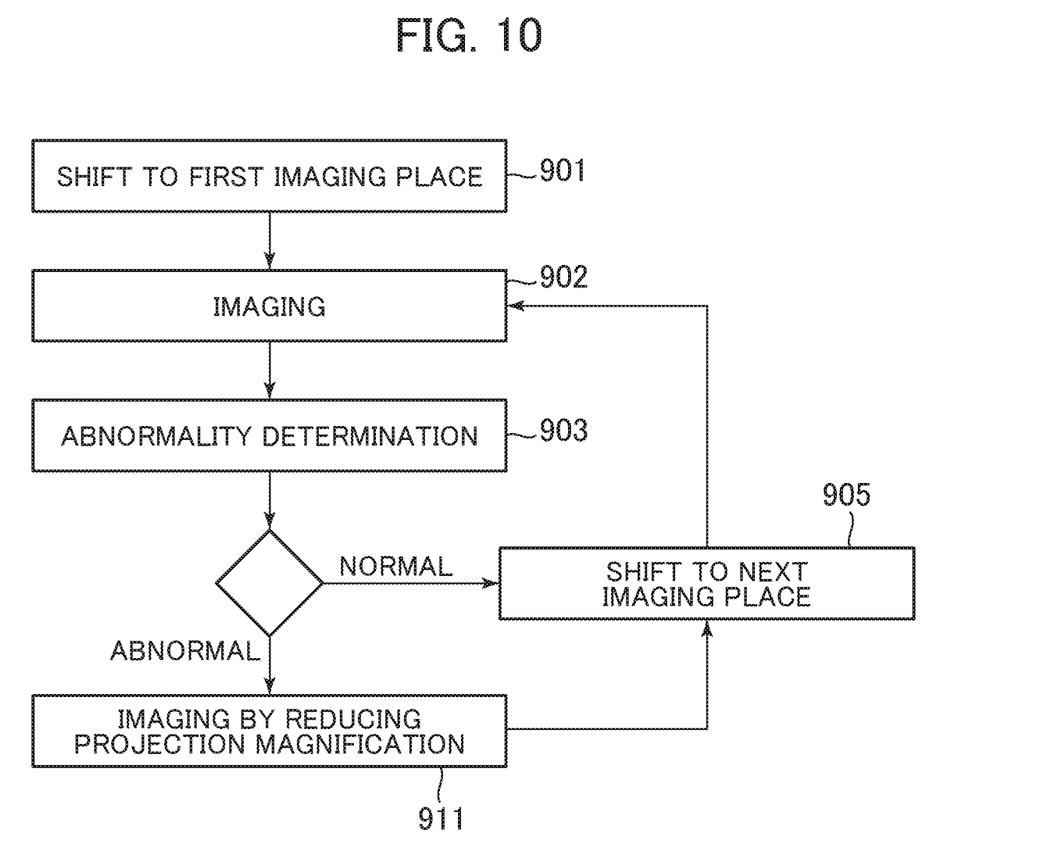
FIG. 10 is another flowchart for high-speed inspection.

Otherwise, as shown in a flowchart of FIG. 10, instead of Step 904 in FIG. 9, an SEM image of an improved resolution is acquired by additionally photographing an image at a reduced projection magnification (Step 911). By those measures, both high-speed inspection and analysis facilitation by an electron beam device can be attempted to be obtained.

Figure 11:
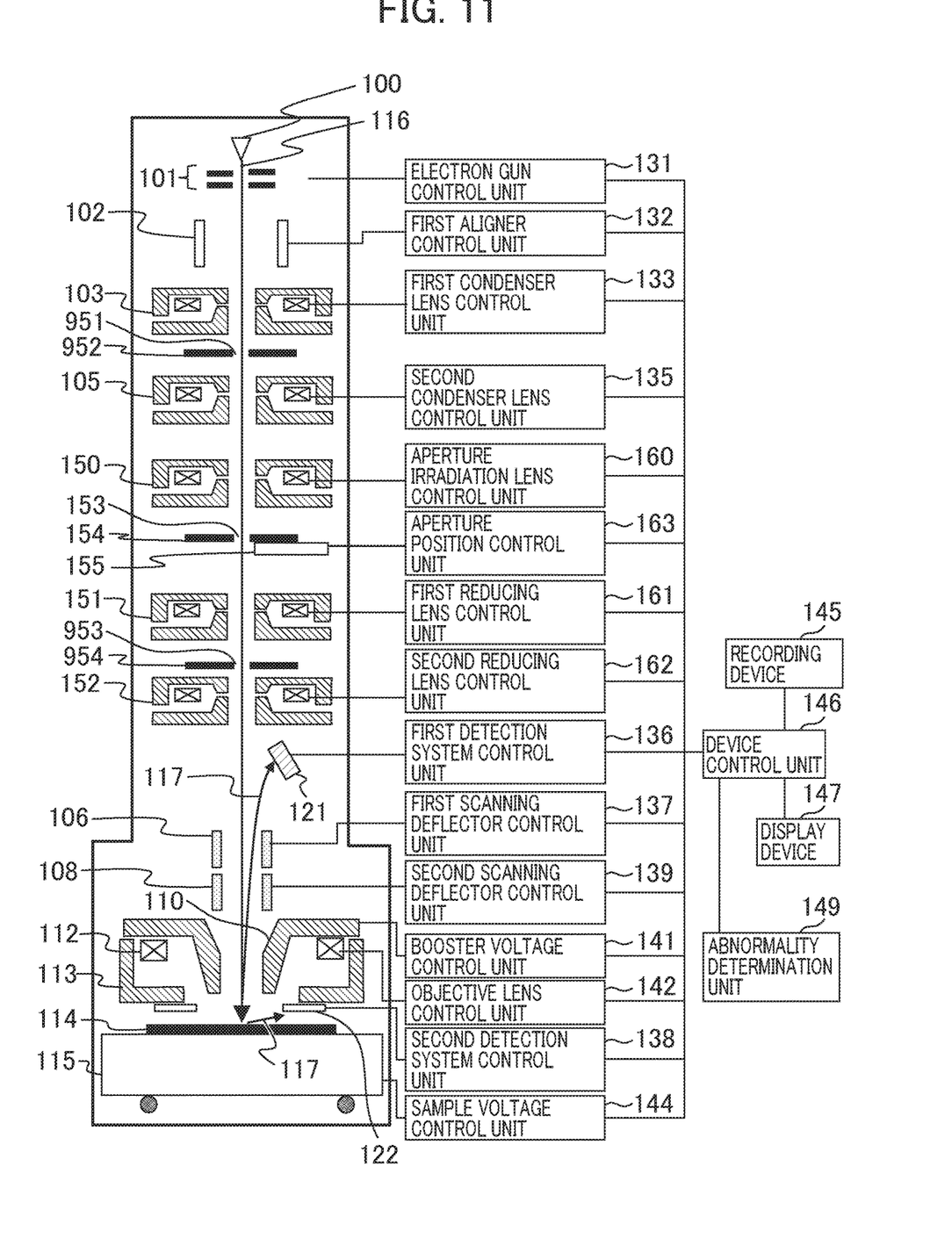
FIG. 11 is an overall schematic diagram of a scanning electron microscope (modified example).

An overall schematic diagram (modified example) of a scanning electron microscope shown in FIG. 1 is shown in FIG. 11. In this example, a first aperture plate 952 having a first aperture 951 is installed in an irradiation optical system and a second aperture plate 954 having a second aperture 953 is installed in a reduction projection optical system. The concrete arrangement places are examples and, in this case, the first aperture plate 952 is installed between a first condenser lens 103 and a second condenser lens 105 and the second aperture plate 954 is installed between a first reducing lens 151 and a second reducing lens 152.

The first aperture 951 prevents electron beam characteristics from deteriorating by a coulomb effect by reducing the amperage of an electron beam at an earliest possible stage after the electron beam is emitted from an electron source 100. The amperage applied to a sample is decided by the aperture 153 of a latter stage. Further, the second aperture 953 controls an interference effect as the waves of an electron beam and thus controls a diffraction aberration and a beam blur during defocusing. The size of the second aperture 953 is desirably larger than the half width of an electron beam at the aperture position and moreover other influence given to electron beam characteristics can be ignored by transmitting most of the electron beam. As a result, inspection and analysis by an electron beam device can be carried out stably.

Such an electron beam device projecting an aperture image on a sample as stated above: can decide an aperture image size that comes to be the main factor of resolution deterioration particularly under a large current condition by an aperture shape and a projection magnification; and hence facilitates control. As a result, the electron beam device is effective also from the viewpoint of reducing machine difference.

Meanwhile, the present invention is not limited to the aforementioned embodiments and includes various modified examples. For example, the aforementioned embodiments are explained in order to make the present invention easy to understand and not necessarily limited to the cases having all the explained configurations. Further, it is possible to: replace a part of a configuration of an example with a configuration of another example; and also add a configuration of an example to a configuration of another example. Furthermore, it is also possible to add, delete, or replace a part of a configuration in each of the examples to, from, or with another configuration. Moreover, although the present invention has been explained on the basis of a scanning electron microscope used for the observation, inspection, measurement, and the like of a sample in the embodiments, the present invention can be applied to a drawing device. Even in a case of changing a beam current density in accordance with the material of a resist and the like by controlling a projection magnification and an aperture angle in accordance with the amperage of an electron beam, a picture can be drawn appropriately by changing the optical conditions of the electron beam easily.

LIST OF REFERENCE SIGNS

101: Electron gun, 102: First aligner, 103: First condenser lens, 105: Second condenser lens, 106: First scanning deflector, 108: Second scanning deflector, 113: Objective lens, 114: Sample, 115: Stage, 116: Primary electron, 117: Secondary electron, 121: First detector, 122: Second detector, 131: Electron gun control unit, 132: First aligner control unit, 133: First condenser lens control unit, 135: Second condenser lens control unit, 136: First detection system control unit, 137: First scanning deflector control unit, 138: Second detection system control unit, 139: Second scanning deflector control unit, 141: Booster voltage control unit, 142: Objective lens control unit, 144: Sample voltage control unit, 145: Recording device, 146: Device control unit, 147: Display device, 149: Abnormality determination unit, 150: Aperture irradiation lens, 151: First reducing lens, 152: Second reducing lens, 153: Aperture, 154: Aperture plate, 155: Aperture plate stage, 161: First reducing lens control unit, 162: Second reducing lens control unit, 163: Aperture position control unit, 190: First magnetic shield, 191: Second magnetic shield, 201: Electron source reference trajectories, 202: Aperture reference trajectories, 210: Electron source first intermediate image, 211: Electron source second intermediate image, 212: Electron source third intermediate image, 213: Electron source image, 220: Aperture intermediate image, 221: Aperture image, 251: Aperture right-end trajectories, 252: Aperture left-end trajectories, 402: Aperture angle, 403: Incidence angle, 951: First aperture, 952: First aperture plate, 953: Second aperture, 954: Second aperture plate

The invention claimed is:

1. An electron beam device having:
an electron optical system having an irradiation optical system to irradiate an aperture with an electron beam emitted from an electron source and a reduction projection optical system to project and form an aperture image of the aperture on a sample; and
a control unit to control a projection magnification of the aperture image of the aperture projected and formed on the sample and an aperture angle of the electron beam emitted to the sample by the electron optical system,
wherein the irradiation optical system has a first condenser lens, a second condenser lens, and an aperture irradiation lens;
the reduction projection optical system has a first reducing lens, a second reducing lens, and an objective lens;
the aperture irradiation lens is set so as to vertically emit an electron source intermediate image formed by the first condenser lens and the second condenser lens toward the aperture; and
the control unit controls the projection magnification while a position of an electron source image formed by the first reducing lens and the second reducing lens is retained on a back focal plane of the objective lens by connectively controlling an excitation direction of the second reducing lens so as to be opposite to an excitation direction of the first reducing lens.

2. The electron beam device according to claim 1, wherein the control unit focuses the electron beam on the sample by controlling the objective lens after controlling the first reducing lens and the second reducing lens.

3. The electron beam device according to claim 1, wherein the control unit controls the aperture angle while a position of the electron source intermediate image formed by the first condenser lens and the second condenser lens is retained by connectively controlling an excitation direction of the second condenser lens so as to be opposite to an excitation direction of the first condenser lens.

4. The electron beam device according to claim 3, wherein an intensity of the aperture irradiation lens is fixed.

5. The electron beam device according to claim 1, wherein the aperture is a round aperture.

6. The electron beam device according to claim 1, wherein the electron beam device has a first magnetic shield between the aperture and the first reducing lens and a second magnetic shield between the first reducing lens and the second reducing lens.

7. The electron beam device according to claim 1, wherein the electron beam device has a first aperture in the irradiation optical system and a second aperture in the reduction projection optical system.

8. The electron beam device according to claim 7, wherein the size of the second aperture is larger than a half width of the electron beam at an aperture position.

9. An electron beam device having:
an electron optical system having an irradiation optical system to irradiate an aperture with an electron beam emitted from an electron source and a reduction projection optical system to project and form an aperture image of the aperture on a sample; and
a control unit to control a projection magnification of the aperture image of the aperture projected and formed on the sample and an aperture angle of the electron beam emitted to the sample by the electron optical system,
wherein the irradiation optical system has a first condenser lens, a second condenser lens, and an aperture irradiation lens,
the reduction projection optical system has a first reducing lens, a second reducing lens, and an objective lens,
the aperture irradiation lens is set so as to vertically emit an electron source intermediate image formed by the first condenser lens and the second condenser lens toward the aperture,
the control unit controls the projection magnification while a position of an electron source image formed by the first reducing lens and the second reducing lens is retained on a back focal plane of the objective lens by connectively controlling an excitation direction of the second reducing lens so as to be opposite to an excitation direction of the first reducing lens, the electron beam device has a first aperture in the irradiation optical system and a second aperture in the reduction projection optical system, the size of the second aperture is larger than a half width of the electron beam at an aperture position, and the electron beam device has a first magnetic shield between the aperture and the first reducing lens and a second magnet shield between the first reducing lens and the second reducing lens.

\* \* \* \* \*